United States Patent [19]

Chappell et al.

[11] Patent Number: 4,460,910

[45] Date of Patent: Jul. 17, 1984

[54] HETEROJUNCTION SEMICONDUCTOR

[75] Inventors: Barbara A. Chappell; Terry I. Chappell, both of Amawalk; Jerry M. Woodall, Bedford Hills, all of N.Y.

[73] Assignee: International Business Machines Corporation, Armonk, N.Y.

[21] Appl. No.: 324,240

[22] Filed: Nov. 23, 1981

[51] Int. Cl.[3] ............... H01L 29/80; H01L 29/48; H01L 29/161; H01L 29/06

[52] U.S. Cl. ................................ 357/22; 357/15; 357/16; 357/55; 357/56

[58] Field of Search ............... 357/22 V, 22 P, 22 G, 357/22, 16, 55, 15, 56, 15 P

[56] References Cited

U.S. PATENT DOCUMENTS

| | | | |
|---|---|---|---|
| 3,614,549 | 10/1971 | Lorenz | 357/16 |
| 3,801,391 | 4/1974 | Dyment et al. | 357/16 |
| 3,814,993 | 6/1974 | Kennedy | 357/30 |
| 3,833,435 | 9/1974 | Logan et al. | 156/11 |
| 3,958,143 | 5/1976 | Bell | 357/16 |
| 3,982,261 | 9/1976 | Antypas | 357/16 |
| 4,075,652 | 2/1978 | Umebachi et al. | 357/22 |
| 4,111,725 | 9/1978 | Cho et al. | 148/175 |
| 4,128,733 | 12/1978 | Fraas et al. | 357/16 |
| 4,135,954 | 1/1979 | Chang et al. | 148/187 |
| 4,173,763 | 11/1979 | Chang et al. | 357/16 |
| 4,198,644 | 4/1980 | Esaki | 357/16 |
| 4,226,649 | 10/1980 | Davey et al. | 148/175 |
| 4,236,166 | 11/1980 | Cho et al. | 357/16 |
| 4,262,296 | 4/1981 | Shealy et al. | 357/55 |
| 4,364,072 | 12/1982 | Nishizawa | 357/22 |

FOREIGN PATENT DOCUMENTS 53-84570  7/1978  Japan .................. 357/225

OTHER PUBLICATIONS

IEEE Journal of Solid State Circuits, vol. SC9, No. 5, Oct. 1974, pp. 256-268.
IEEE Transactions on Electron Devices, vol. ED-26, No. 6, Jun. 1979, pp. 980-986, (FIG. 2).
IEEE Transactions on Electron Devices, vol. ED-26, No. 3, Mar. 1979, pp. 172-182.
Solid-State Electronics, vol. 24, 1981, pp. 621-627.
Journal of Applied Physics, vol. 40, No. 1, Jan. 1969, pp. 438-439.
Solid-State Electronics, vol. 10, 1967, pp. 449-460.

*Primary Examiner*—Andrew J. James
*Assistant Examiner*—Jerome Jackson
*Attorney, Agent, or Firm*—Alvin J. Riddles

[57] ABSTRACT

A heterojunction semiconductor is provided where the carrier transport dimension is governed by a layer thickness and where the characteristics of the materials self-limit process steps. A field effect transistor is provided wherein the work function is matched across regions to reduce limits on the channel dimension. A vertical transistor is provided wherein a vertical web is formed with precise thickness governed by electrolytic etching using photogenerated carrier current.

6 Claims, 22 Drawing Figures

HETEROJUNCTION SEMICONDUCTOR

DESCRIPTION

1. Technical Field

The technical field of the invention is that of very small dimension semiconductor devices.

As the semiconductor art has developed, the dimensions required for high performance have been reaching values so small that direct control of each fabrication operation is becoming costly and somewhat unreliable and attention is being directed to indirect control.

2. Background Art

There are several illustrations of such small dimension devices that are fabricated using indirect dimension control.

One technique of device fabrication involves the use of a region that is an undercut web between two broader areas. This technique is employed in U.S. Pat. No. 3,833,435 where the device is a waveguide and in U.S. Pat. No. 4,111,725, FIG. 2, where the device is a horizontal field effect transistor.

Another technique of device fabrication involves the use of different etch responsive layers. A planar semiconductor device using this technique has been constructed as illustrated in U.S. Pat. No. 4,135,954.

The instances of indirect control thus far in the art have been usually directed to a single parameter.

DISCLOSURE OF THE INVENTION

In accordance with the invention, a fabrication technique is provided wherein the starting configuration and the properties of the materials of which the structure is made are interrelated with and make possible fabrication processing approaches that result in a structure where dimensions are the result of the properties and the arrangement of the materials and are self-limiting at the correct value.

One of the most critical dimensions in semiconductors is the carrier transport length of the region of the device through which carriers, either majority or minority, must traverse between junctions. Many of the limitations on device fabrication are related to deleterious effects on this dimension such as processing step heat degradation, or to impurity location imprecision.

In accordance with the invention, this carrier transport dimension for the device to be produced is provided in the starting intermediate product structure under the precise dimension control of the crystal fabrication operation.

Figure 1:
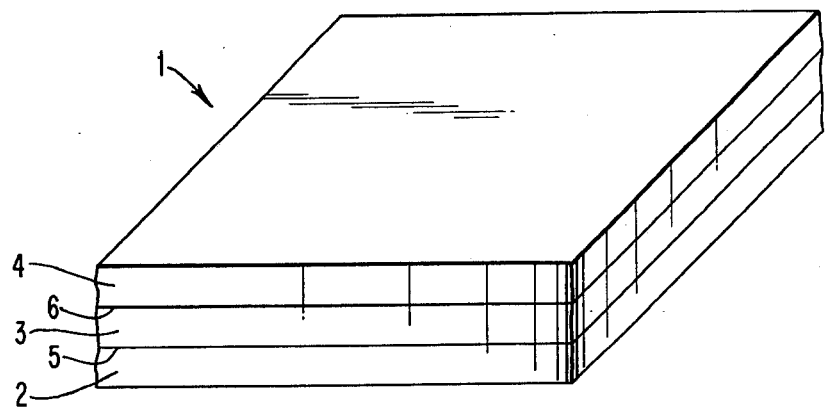
FIG. 1 is a schematic view of an intermediate structure in fabricating a heterojunction semiconductor.

Referring to FIG. 1, the starting intermediate product is a monocrystalline semiconductor member 1 having at least three layers 2, 3 and 4. The layers 2 and 4 are generally of a different semiconductor material from the central region 3 and each respectively forms a semiconductor carrier responsive heterojunction 5 and 6. The layer 3 thickness between the junctions 5 and 6 is to be the carrier transport dimension in the final semiconductor device.

Figure 2:
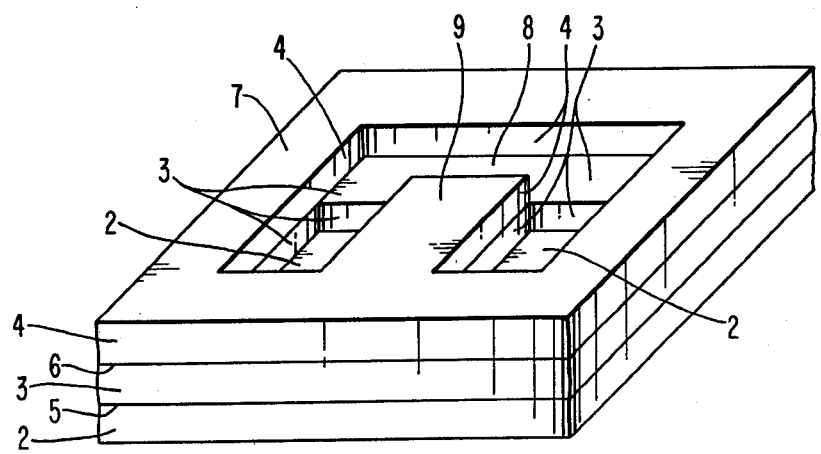
FIG. 2 is an illustration of the structural effect of processing steps on the intermediate structure of FIG. 1.

Referring to FIG. 2, there is shown the result of a processing operation wherein through the upper surface an opening 8 is made that exposes both the region 2 and the region 3 with an elongated portion 9 and permits a device to be fabricated in the portion 9 having a precise carrier transport dimension already established by the thickness of layer 3 and external contacting capability established by layers 2 and 4 and the exposed portion of layer 3.

The intermediate structure of the invention permits a number of processing advantages. It permits low temperature fabrication, photoetch thinning, selective oxidation and selective plating. These steps in turn provide a vertical heterojunction structure and permit selection of materials to gain device advantages.

One particular device advantage is the ability to minimize work function differences between regions of a field effect transistor device.

In accordance with the invention, a field effect transistor structure is provided wherein multiple semiconductor materials having carefully selected work functions operate to prevent boundary limitations between regions of the device such that limits are avoided on how short the field effect channel can be. A structure is provided wherein the work function is the same in all the regions of the device. This permits the energy band edges to change abruptly in going from one region to another and permits the electron concentration profile to also change abruptly. The result of this is that allowance does not have to be made for the boundary carrier condition from one device to the other and the dimensions can be held to much tighter tolerances. This is of importance in the integrated circuit technology wherein the difference between one-half micron gate width in a device and one micron gate width may make the difference between 64,000 and 128,000 devices per one square one-eighth inch.

The advantages of work function matching in a device can best be seen with a comparison of the prior art as set forth in FIGS. 3 through 6 and that of the invention FIGS. 7 through 10.

Figure 3:
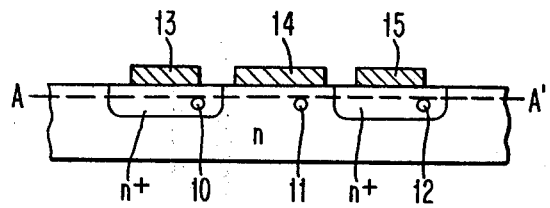
FIG. 3 is a prior art field effect transistor.

Referring to FIG. 3, a conventional field effect transistor is shown wherein a source region 10 is adjacent to a channel region 11 which in turn is adjacent to a drain region 12, the source and drain regions being labelled n+ indicative of higher conductivity and the lower conductivity channel region being labelled n, as is conventional in the art. The regions are made in a substrate and have ohmic contacts 13, 14 and 15, respectively, to the source, channel and drain.

Figure 4:
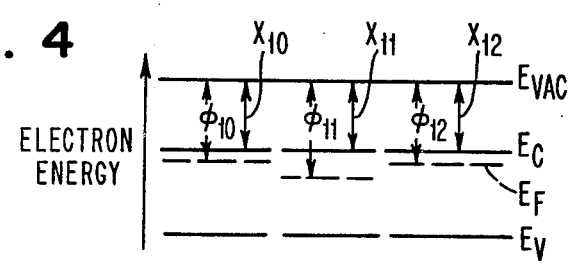
FIGS. 4 and 5 are electron energy diagrams dimensionally correlated with FIG. 3.
Figure 5:
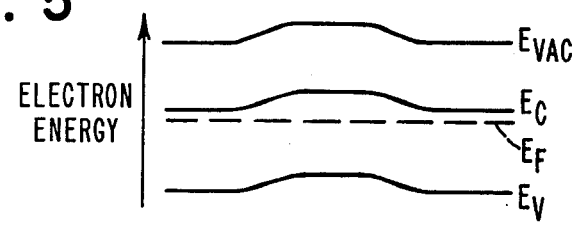
Figure 6:
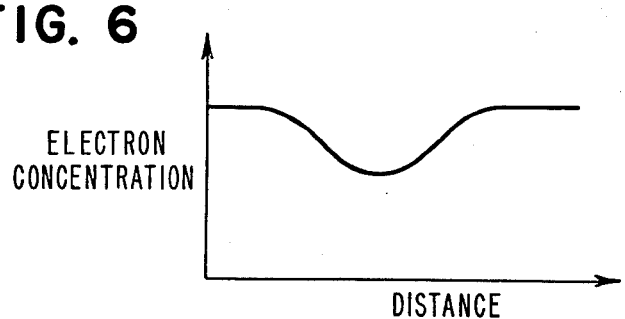
FIG. 6 is an electron concentration diagram dimensionally correlated with FIG. 3.

FIGS. 4, 5 and 6 are electron energy and concentration diagrams taken along the line A—A' of FIG. 3 with the assumptions that the sections of the device are separated in FIG. 3 and the electron affinity χ having subscripts 10, 11 and 12 is the same for all three regions whereas the work function labelled φ with subscripts 10, 11 and 12 for the regions may differ since it goes from the vacuum level to the Fermi level.

The effect of this may be seen in FIG. 5 when the sections of the device are in theory joined. In this case, the band edges must change gradually in going from one region to another and referring to FIG. 3, it will be apparent that the gradual change will have an effect on the length of the channel 11 that can be tolerated. This effect is known in the art as short channel effect. This is even further illustrated in the electron concentration diagram of FIG. 6. Here, the electron concentration in the region that would be the channel region 11 is significantly increased by electrons flowing into it from the adjacent regions.

A prior art type structure as illustrated in FIG. 3 would have constraints on the dimensions of the channel relaxed with the work function matching technique of the invention as set forth in FIGS. 7 through 10.

Figure 7:
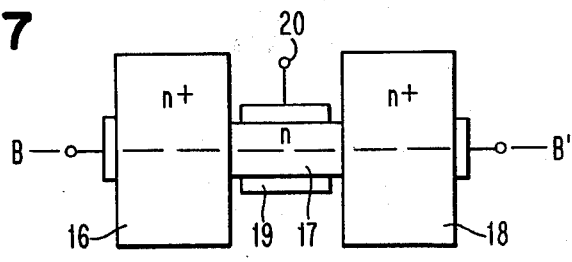
FIG. 7 is an illustration of the device of the invention.

Referring to FIG. 7, in accordance with the invention, a structure is shown having a source region 16, a channel region 17 and a drain region 18 in standard field effect transistor relationships wherein the regions 16, 17 and 18 correspond respectively to regions 2, 3 and 4 of FIG. 1.

In accordance with the invention, the device will be a heterojunction device in which at least two of the regions are different semiconductor materials. For purposes of illustration of the full effect of the invention, it is shown such that region 16, region 17 and region 18 are all of different semiconductor materials, chosen such that the work function of all three are the same. The structure of FIG. 7 also shows the channel region 17 as having gate electrodes 19 and 20, respectively, on each side which can be used to reduce either channel resistance or device area or both compared to the conventional device of FIG. 3.

Figure 8:
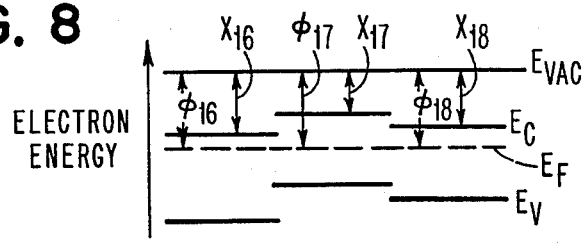
FIGS. 8 and 9 are electron energy diagrams dimensionally correlated with FIG. 7.

In accordance with the invention, the structure of FIG. 7 is made up of different semiconductor materials so chosen that the electron work function as shown in FIG. 8 in each of the regions is equal as set forth in Equation 1, the components of which are obtained from Equations 2, 3 and 4.

Where: $\phi$ is the electron work function in electron volts and $\phi_S$, $\phi_C$ and $\phi_D$ are the electron work functions in the source 16, the channel 17 and the drain 18 regions, respectively.

$\chi$ is the electron affinity in electron volts and $\chi_S$, $\chi_C$ and $\chi_D$ are the electron affinities of the source, the channel and the drain regions, respectively.

$E_C$ is the energy at the bottom of the conduction band and $E_{CS}$, $E_{CC}$ and $E_{CD}$ are the energies at the bottom of the conduction band in the source, the channel and the drain regions, respectively.

$E_F$ is the energy at the Fermi level and $E_{FS}$, $E_{FC}$ and $E_{FD}$ are the energies at the Fermi level of the source, the channel and the drain regions, respectively, and q is the electronic charge.

$$\phi_S = \phi_C = \phi_D \qquad \text{Eq. 1}$$

$$\phi_S = \chi_S + \frac{E_{CS} - E_{FS}}{q} \qquad \text{Eq. 2}$$

$$\phi_C = \chi_C + \frac{E_{CC} - E_{FC}}{q} \qquad \text{Eq. 3}$$

$$\phi_D = \chi_D + \frac{E_{CD} - E_{FD}}{q} \qquad \text{Eq. 4}$$

Referring next to FIG. 8, an electron energy diagram is provided for the structure of FIG. 7 wherein the subscripts 16, 17 and 18 are employed. The energy diagram is taken along the line B—B' of FIG. 7 with the assumption that the sections of the device are separated. In accordance with the invention, the materials of the various regions are chosen so that the work functions $\phi_{16}$, $\phi_{17}$ and $\phi_{18}$ are all equal whereas the electron affinities may all differ. The effect of this on the structure may be seen in connection with FIG. 9 wherein the electron energy is shown, assuming the sections of the device are now adjacent to each other. Here, in contrast with FIG. 5 of the prior art, the energy band diagram permits the band edges to change abruptly in going from one region to another and some of the physical dimension of the central channel region does not have to be allowed for the variation in band energy.

Figure 10:
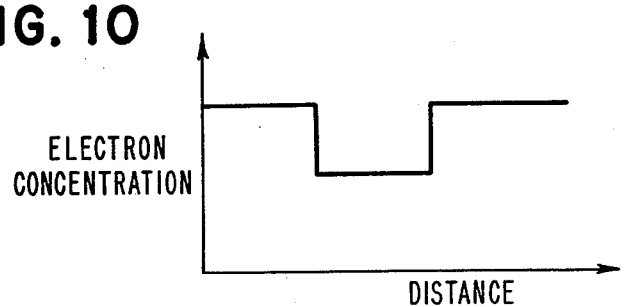
FIG. 10 is an electron concentration diagram dimensionally correlated with FIG. 7.

Referring next to FIG. 10, the electron concentration changes abruptly in going from one region to another so that the electron concentration in the channel region is not influenced by the regions adjacent to it and this may be compared with FIG. 6 wherein the electron concentration is significantly influenced by the regions adjacent to it.

Figure 9:
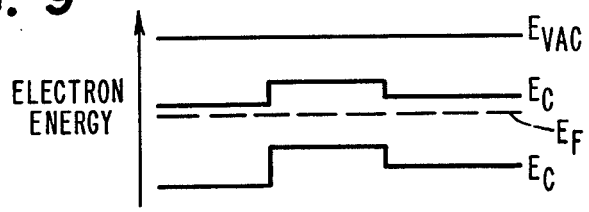

It will be apparent to one skilled in the art in the light of the principles set forth that while three different semiconductor materials were shown, gradations in the advantages of the invention may be achieved so long as there are at least two that produce similar work functions in two different regions. At least some of applicants effect as shown in FIGS. 9 and 10 will obtain and this will be an improvement over the present state of the art as represented by FIGS. 5 and 6.

The invention may be practiced through techniques of fabrication of semiconductor devices wherein a very precisely controlled thin vertical web is made between two broader area regions and ohmic contacts are provided to all three.

The invention employs as a starting substrate a member as shown in FIG. 1 having at least two types of layers in a three-layer structure, the center layer of which having the transport dimension established by the positioning of the heterojunction between layers.

Figure 11:
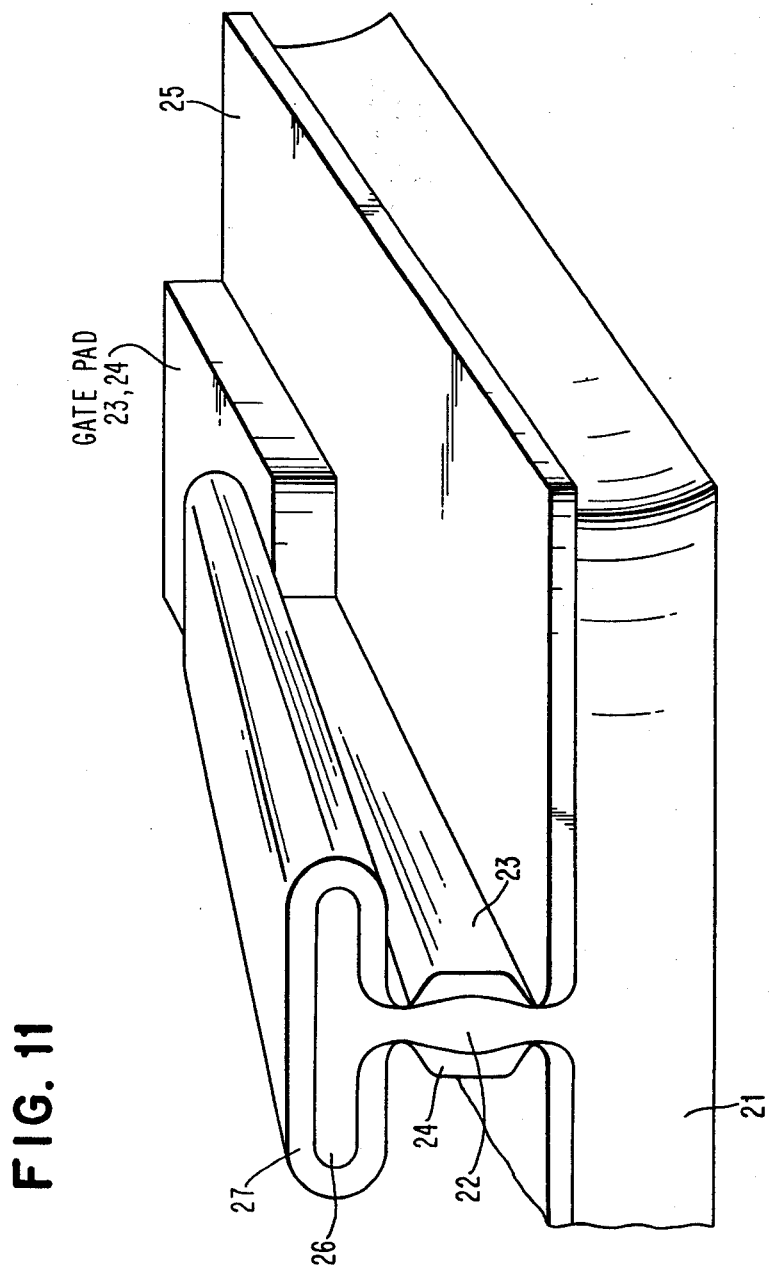
FIG. 11 is a schematic view of a vertical structure employing the invention.

Referring to FIG. 11, the invention is employed to produce a vertical field effect type transistor wherein a source region 21 corresponds to the lowermost region 2 of the three-layered substrate 1 of FIG. 1. The channel region 22 is a thin vertical web fabricated from the central second layer 3 of FIG. 1 on which gate metal regions 23 and 24 have been deposited. An insulating oxide 25 is provided over region 21. The drain region 26 is the layer 4 of the starting structure 1 of FIG. 1. An insulating oxide 27 is provided over the drain region 26. Source and drain ohmic contacts not shown would be made to the source 21 and drain 26 regions.

The thickness of the web of the gate region 22 is achieved using a self-limiting technique such as that described in U.S. Pat. No. 4,351,706. In that technique an electrolytic etching operation using photogenerated carriers is employed to establish the desired dimension and the process self-limits at the appropriate size. Following the electrolytic etching operation, the oxides 25 and 27 are grown using an anodic oxidation technique since the regions 21 and 26 are conductive.

BEST MODE FOR CARRYING OUT THE INVENTION

The invention provides a wide range of structural and processing improvements and these are illustrated in detail in connection with the fabrication of an integrated circuit employing a number of devices of the type in FIG. 11.

Figure 12:
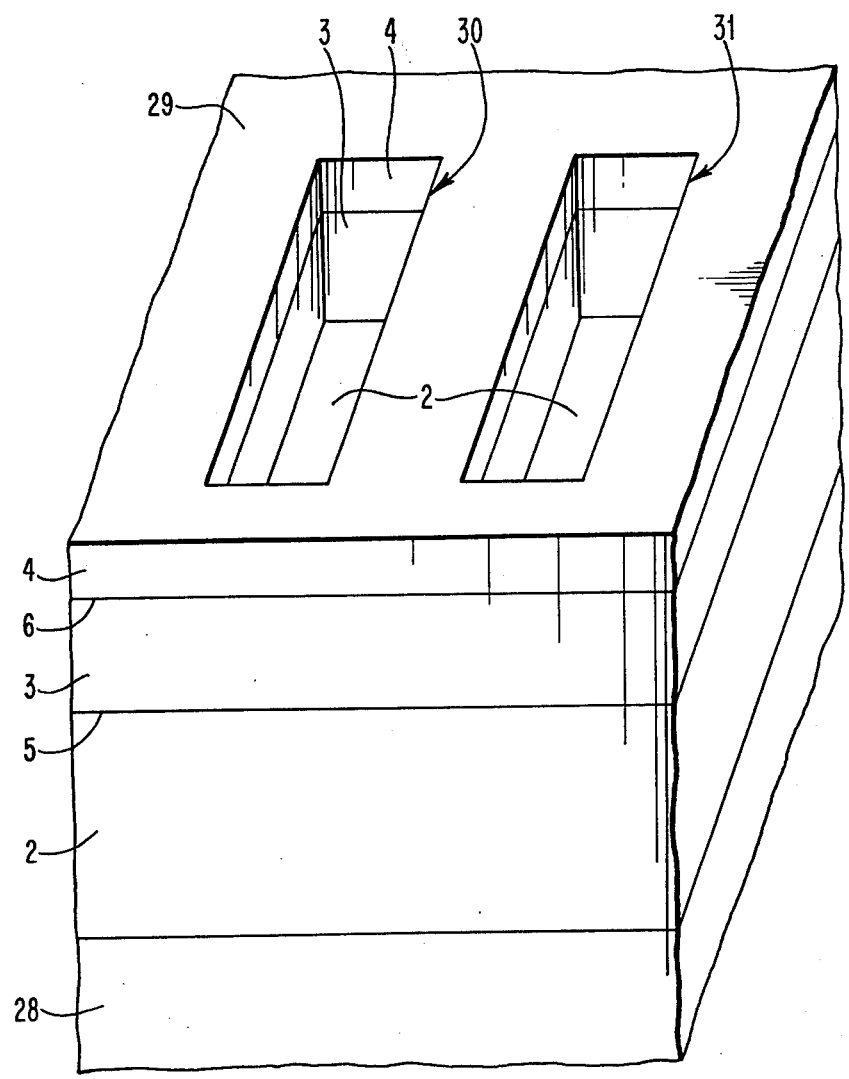
FIG. 12 is an illustration of one intermediate process condition in the fabrication of the invention.

In FIG. 12 an intermediate process step is illustrated wherein the starting structure of FIG. 1 is provided having three epitaxial layers 2, 3 and 4, respectively, on a handling facilitating substrate 28 which is semi-insulating. The uppermost layer 4 is made of a material with a wider bandgap than the bandgap of the center layer 3. The materials for the three layers 2, 3 and 4 are chosen so as to minimize any built-in potential and to optimize the crystal lattice match between the adjacent layers. Each layer 2, 3 and 4 may be doped uniformly so long as the effect on work function between regions is recognized.

Where the structure of FIG. 1 is formed by epitaxial growth, standard impurity inclusion during the growth stages is provided.

In fabricating a device as illustrated in FIG. 11, layers 2 and 4 may be heavily doped n+, for example, to be low resistivity source 21 and drain 26 regions and for the vertical web channel structure 22 an n doping concentration will be maintained in the layer 3. This will impart the desirable current-voltage circuit characteristics to the gate junctions to the channel region 22 which are Schottky barrier junctions between the metal members 23 and 24 and the channel web 22.

The thickness of the layer 3 has been chosen to provide the desired carrier transport dimension for the type of device being built. In the device of FIG. 11 the thickness of the layer 3 will give the desired field effect device channel length. The thickness of the layers 2 and 4 are chosen in order to optimize the stress relief produced by any crystalline lattice spacing mismatch at the n+ n heterojunctions and to minimize electrical resistance.

The thickness of the respective layers and the topology of, for example, layer 4 would be 0.2 micrometers, of layer 3 would be 0.2 micrometers and of layer 2 would be 1.5 micrometers.

In the particular intermediate process step example in FIG. 12 on the upper surface 29, a resist mask has been applied and openings 30 and 31 have been etched through both layers 4 and 3 on either side of a region that is to be the channel 22.

Since, in accordance with the preferred embodiment, an electrolytic etch using photogenerated carriers is to be later employed, the mask patterns should be so designed that after the etching, the layer 4 will be still electrically continuous to the edge of the semiconductor member or wafer, or electrically continuous through some path where more complex structures are being manufactured, so that an applied electrical bias may be used during the later etching process when the specific thickness of the channel region 22 in the layer 3 is defined, during the anodic oxidation when layers 27 and 25 are grown, or during the electroplating operation when the gate metal layer 23 and 24 is applied.

It is of some advantage that each layer 2, 3 and 4 be composed of a different material so that one can be etched independently of the other. This facilitates and provides self-alignment of an underlying edge to the one above and it also prevents accidental etching of underlying areas through defects in a mask.

The view through the openings 30 and 31 in FIG. 12 illustrates both the cross-sectional and the top down view of the structure of the invention as illustrated in FIG. 11 after completion of the processing to this point.

Figure 13:
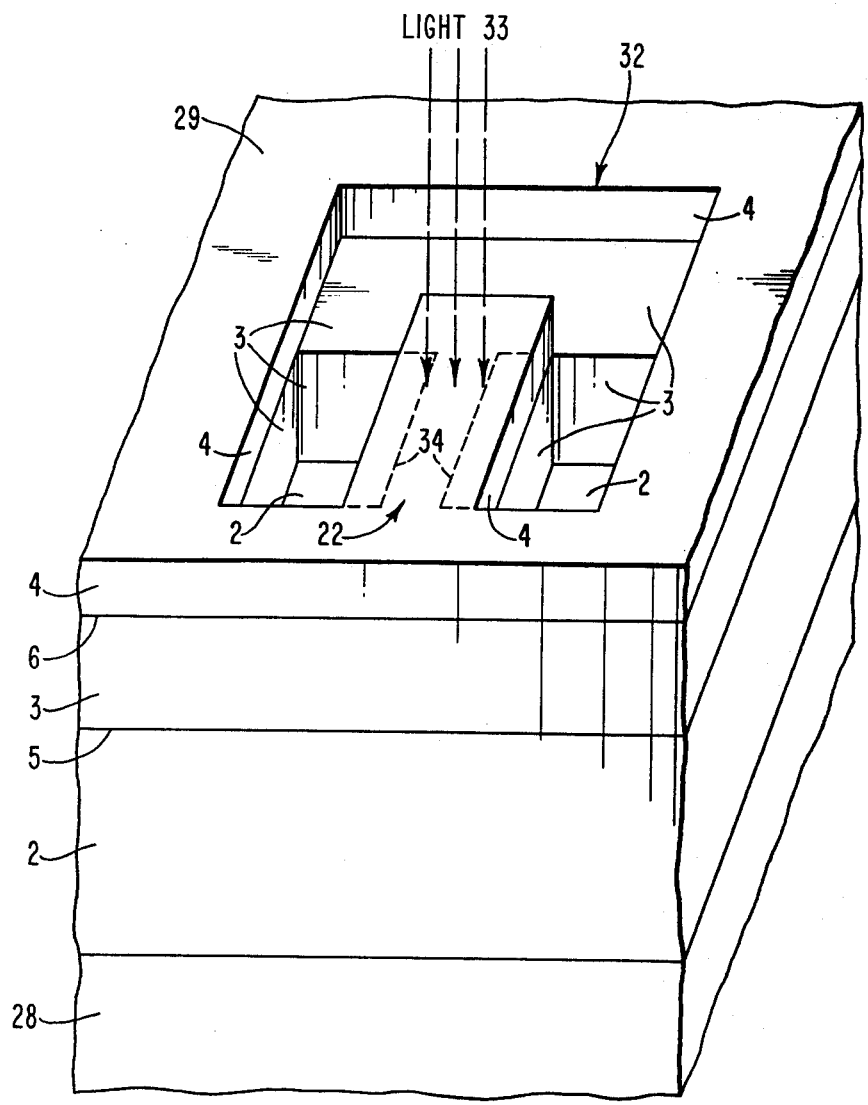
FIG. 13 is an illustration of another intermediate process condition in the fabrication of the invention.

Referring next to FIG. 13, another intermediate process condition is illustrated to facilitate explanation of processing of dimensions of and contacts to the central layer.

Structurally in FIG. 13 an area 32 is opened through layer 4 such as by etching through a mask on surface 29 with an etch that is responsive to the material of layer 4 thereby exposing a portion of layer 3 joining openings 30 and 31 of FIG. 12.

Proton bombardment ion implantation or further etch thinning may be employed in the area of layer 3 in opening 32 immediately adjacent one end of the channel 6 wherein gate contacts are to be placed. This is done to make the exposed portion of layer 4 in opening 32 semi-insulating prior to deposit of metal thereon.

The structure in the condition of FIG. 13 is next place in an electrolytic bath, not shown, while under the influence of a voltage bias between the etch bath and the layer 3 in the presence of illumination by a light 33 focused on the area to become the channel thickness 22 of FIG. 11. The light 33 is of a proper wavelength to penetrate the layer 4 and be absorbed in the layer 3. The absorbed light produces in layer 3 photogenerated carriers that provide free minority carriers to support an electrolytic etching current. The etching operation will proceed to the dotted lines 34 and will self-stop when the layer 3 is etched thin enough so that it is completely depleted of carriers. In some instances the target value of thickness 22 is achieved without the aid of a bias. When needed a voltage bias between the etch bath and the layer 3 may be applied in order to select the precise thickness and therefore the FET device electrical threshold voltage.

Anodic oxidation of all conducting regions which is all regions 21 and 26 of FIG. 11 except the carrier depleted etch thinned channel 22 and the proton bombarded region of layer 3 in opening 32 is next conducted. This forms oxides 25 and 27 in FIG. 11.

Through employing electroless techniques, metal is then plated on all the exposed unoxidized regions of layer 3 so as to provide a gate contact path through the area of opening 32 of FIG. 13 and the gate Schottky barrier diode connections 23 and 24 on each side of the channel 22 in FIG. 11.

Figure 14:
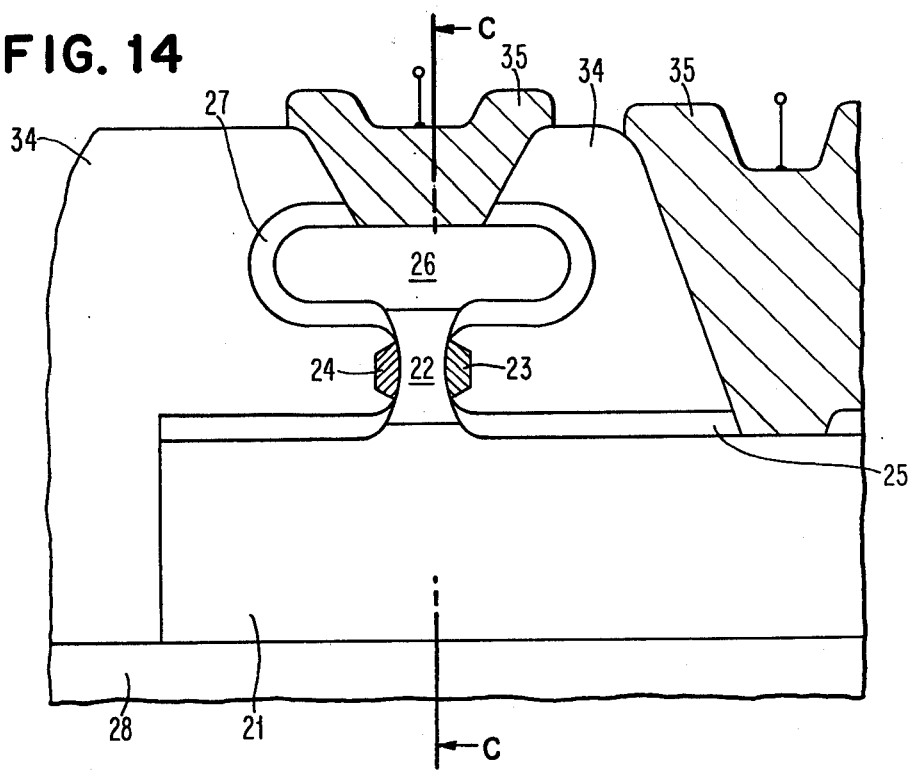
FIG. 14 is an end view of the vertical structure of FIG. 11.
Figure 15:
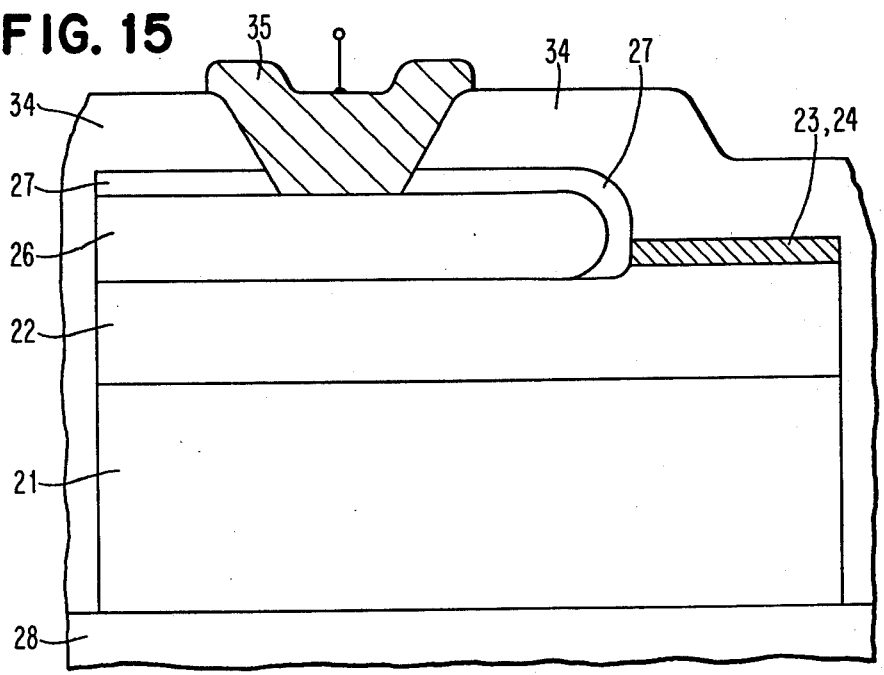
FIG. 15 is a side view of the vertical structure of FIG. 11.

Referring next to FIGS. 14 and 15, there is provided a front view of the structure of FIG. 11 in FIG. 14 and a side view along line C—C' as FIG. 15. The two views show the features of the structure of FIG. 11 to illustrate device isolation and some structural aspects.

In an integrated environment where many devices are provided in a given area, the devices may be isolated by providing non-conducting regions to separate them.

In FIGS. 14 and 15 the isolation is shown as insulation 34 made by etching through all layers to the substrate 28 and then providing insulation such as oxide through the techniques of evaporation, sputtering or spin-on. Alternative techniques, such as proton bombardment or ion implantation, may be used for isolation. Through the employing of contact hole etch and interconnection metallization steps standard in the art metal contacts 35 are provided for circuit purposes. The length, width and thickness of the channel 22 are shown for ease of perception.

The technique of the invention involves an interrelationship of materials, properties and process steps and in order to facilitate practice of the invention there is provided in Table 1 a listing of the materials with the essential physical properties and chemical responsiveness to provide two separate structures.

TABLE 1

|  | FIG. 1 and FIG. 2 Layer # | Material | Band Gap (eV) | Work Function (eV) | Lattice Constant Å | Selective Etchant |
|---|---|---|---|---|---|---|
| Structure 1 | 2 | $Ga_{0.5}In_{0.5}P$ | 1.95 | 4.2–4.3 | 5.654 | HCl |
|  | 3 | GaAs | 1.4 | 4.12–4.17 | 5.654 | Bromine-methanol |
|  | 4 | Ge | 0.8 | 4.13 | 5.658 | $H_2O_2$ |
| Structure 2 | 2 | InP | 1.35 | 4.29 | 5.87 | 1:1 $HCl:H_3PO_4$ |
|  | 3 | GaInAsP | 0.8–1.2 | 4.29–4.5 | 5.87 | $H_3PO_4 \& H_2O_2$ mix |
|  | 4 | InP | 1.35 | 4.29 | 5.87 | 1:1 $HCl:H_3PO_4$ |

Figures 16A, 16B:
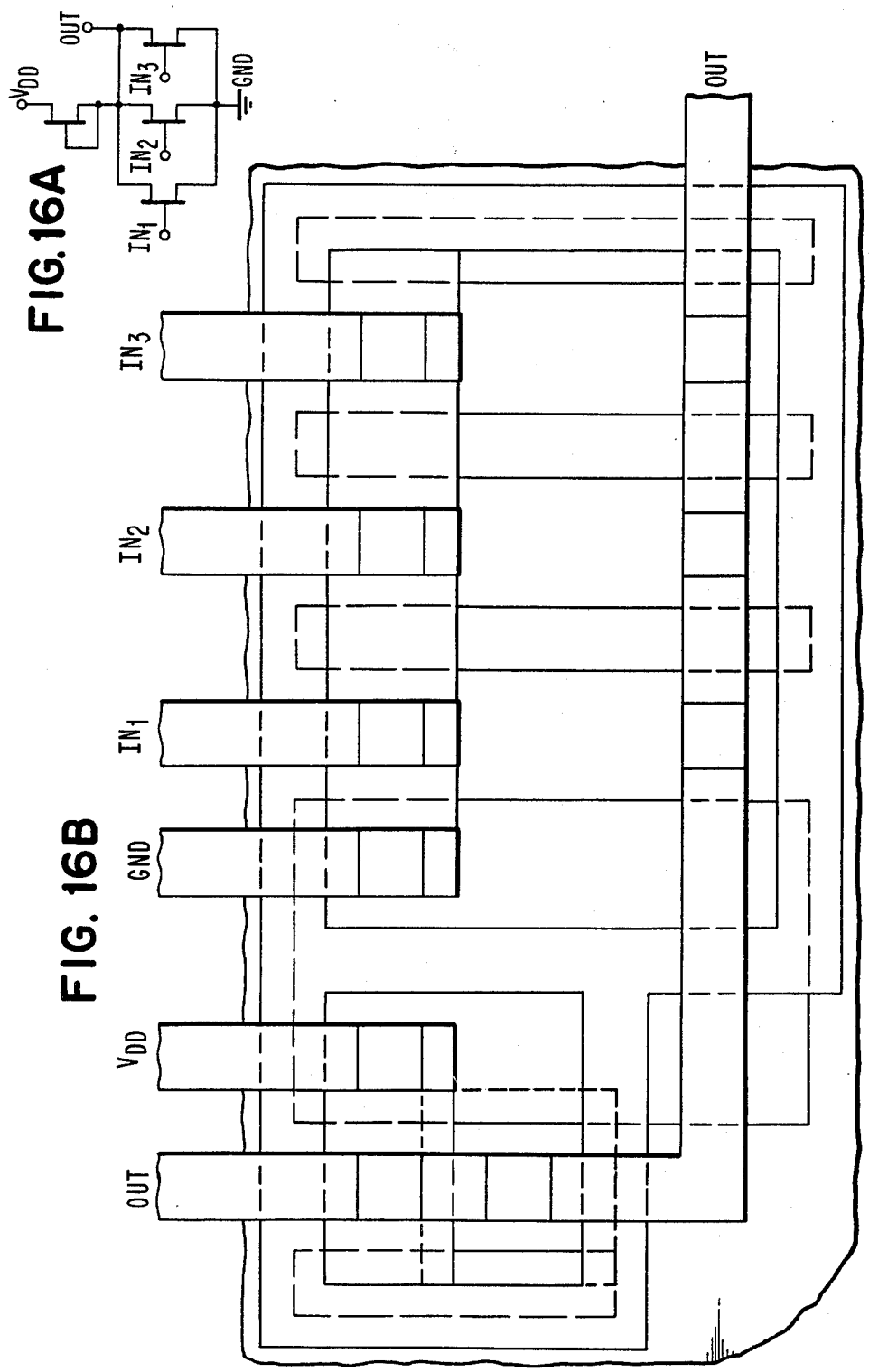
FIGS. 16A and 16B are a circuit and a composite illustration of a mask set for producing the circuit employing the invention.

Referring next to FIGS. 16A and 16B, an illustration is provided of a plurality of the devices of FIGS. 11, 14 and 15 assembled in a standard circuit known in the art as a "NOR" gate together with the masks for production.

The wiring diagram of an example NOR gate is shown in FIG. 16A. The circuit has a separate device for each of three inputs and a load device. In this type of circuit the current through the load device is delivered to the outputs and the output potential will be high if none of the inputs are supplied with a high potential otherwise the load device current is not available to the output and the output potential will be low. The load device in the circuit of FIG. 16A is a depletion mode field effect transistor whereas the input transistors are enhancement mode field effect transistors.

In FIG. 16B there are superimposed six masks that together are used to produce a semiconductor structure of the circuit of FIG. 16A. Each mask is shown individually in FIGS. 17 to 21.

Figure 17:
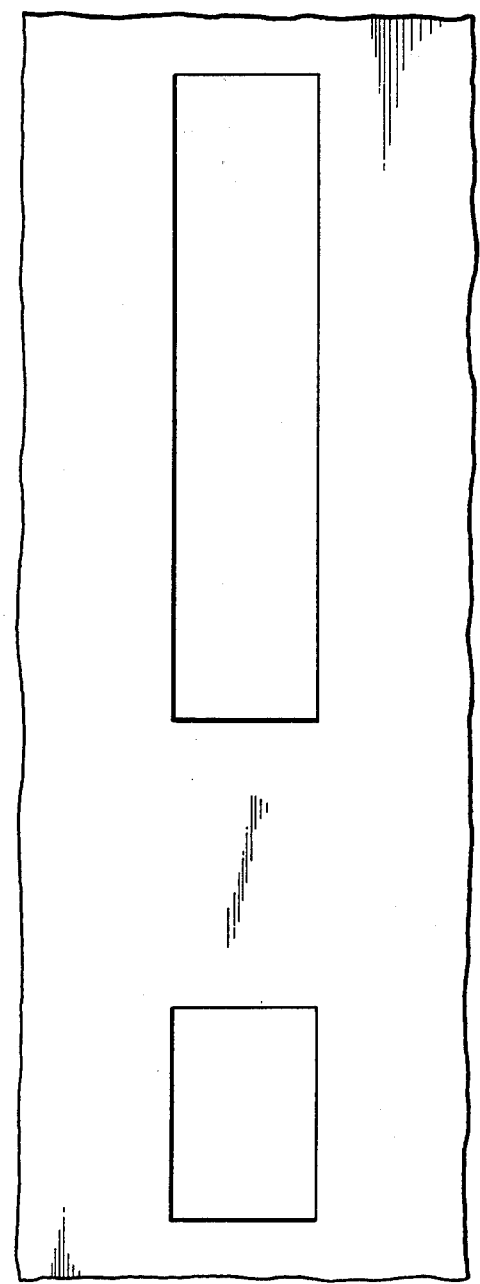
FIGS. 17 to 22 are individual illustrations of masks to produce the integrated circuit of FIGS. 16A and 16B.

FIG. 17 is the outline of the mask that permits removal of layer 4 and defines opening 32 of FIG. 13 to provide the gate pad connection. The mask has a small opening for the load device and larger opening for the three input logic transistors.

Figure 18:
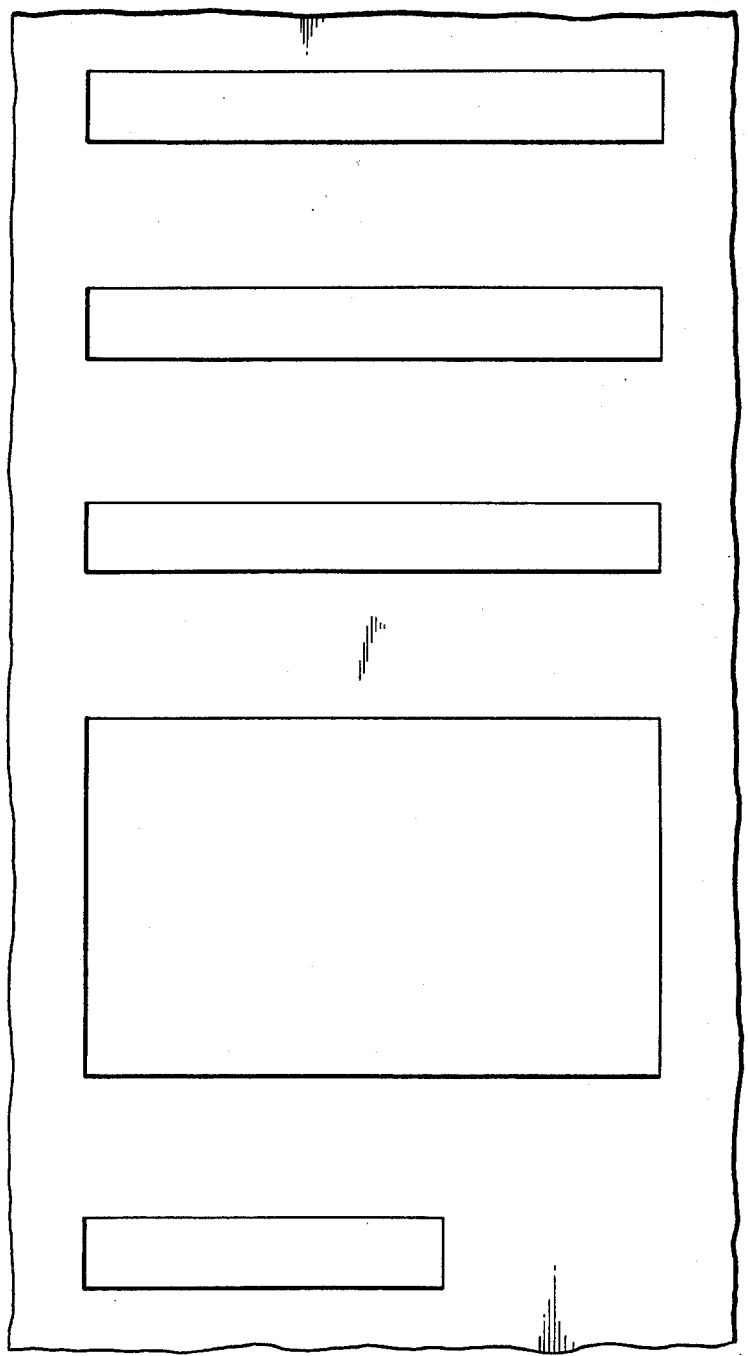

FIG. 18 is the outline of the mask that permits removal of layers 4 and 3 and defines openings 30 and 31 for each device.

Figure 19:
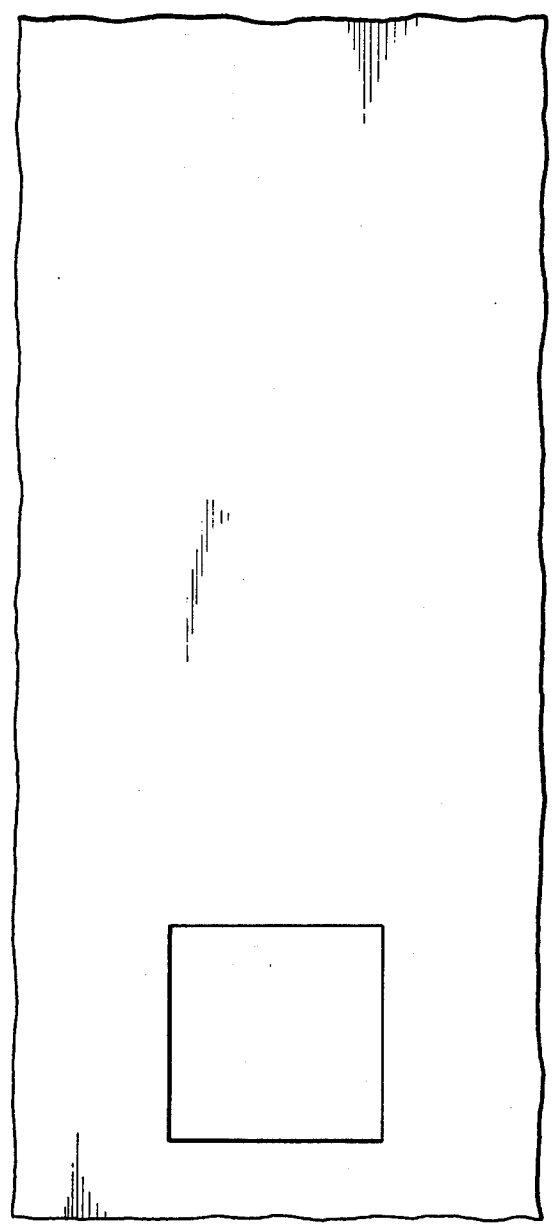

FIG. 19 defines the region within which the threshold voltage will be shifted in order to make the depletion load device.

Figure 20:
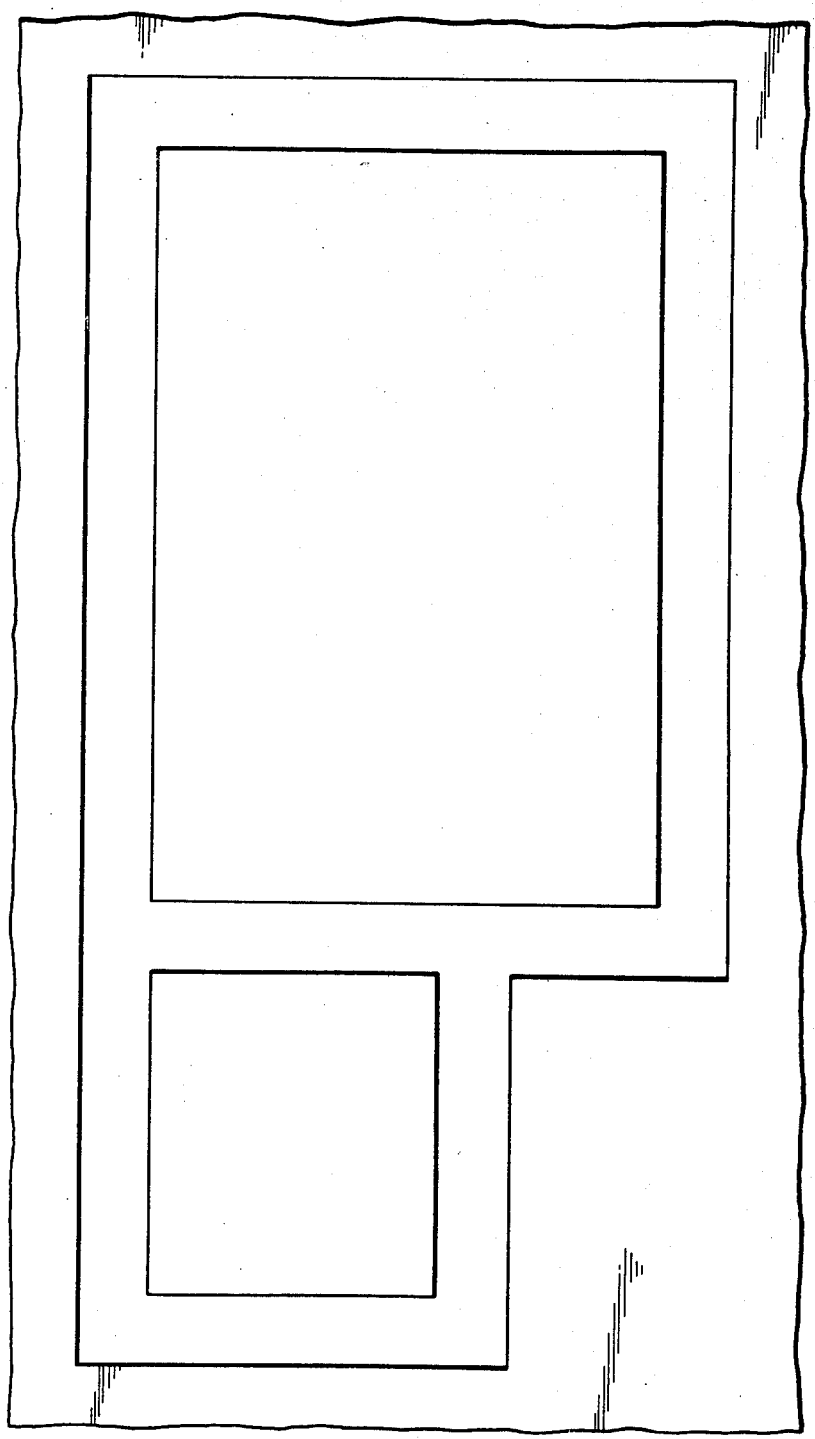

FIG. 20 is the outline of a mask that permits removal of all three layers 2, 3 and 4 to provide the isolation 34.

Figure 21:
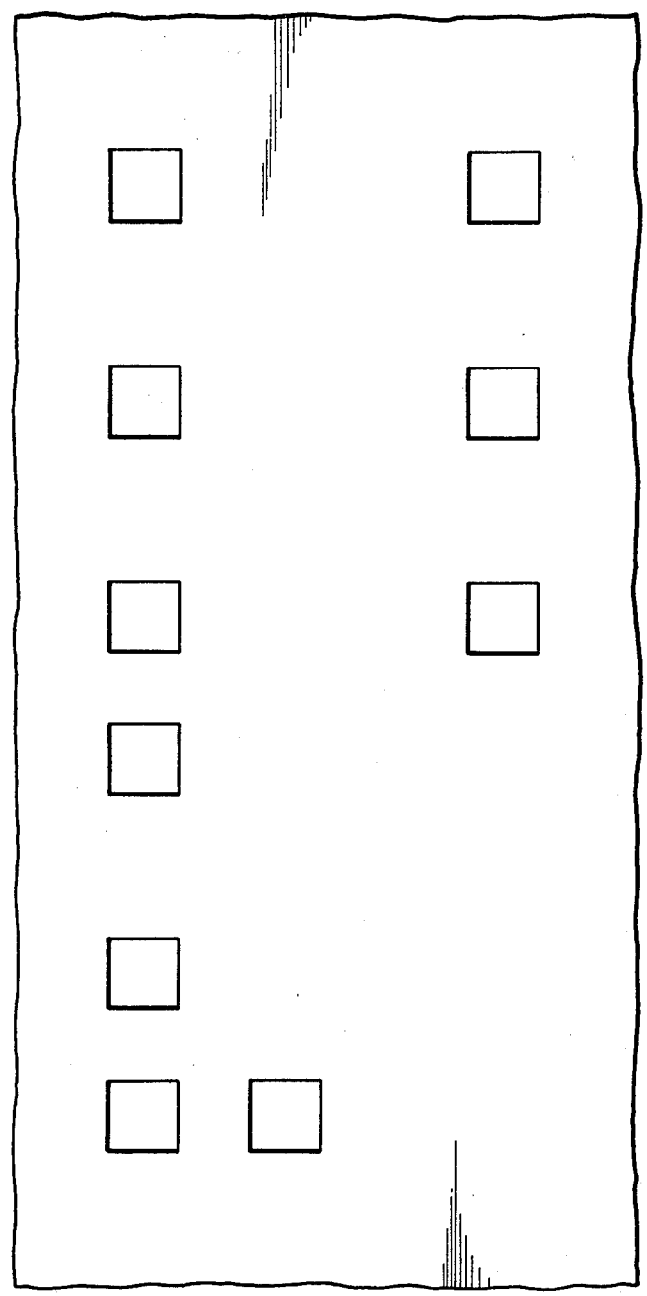

FIG. 21 is the outline of the mask for the contact holes.

Figure 22:
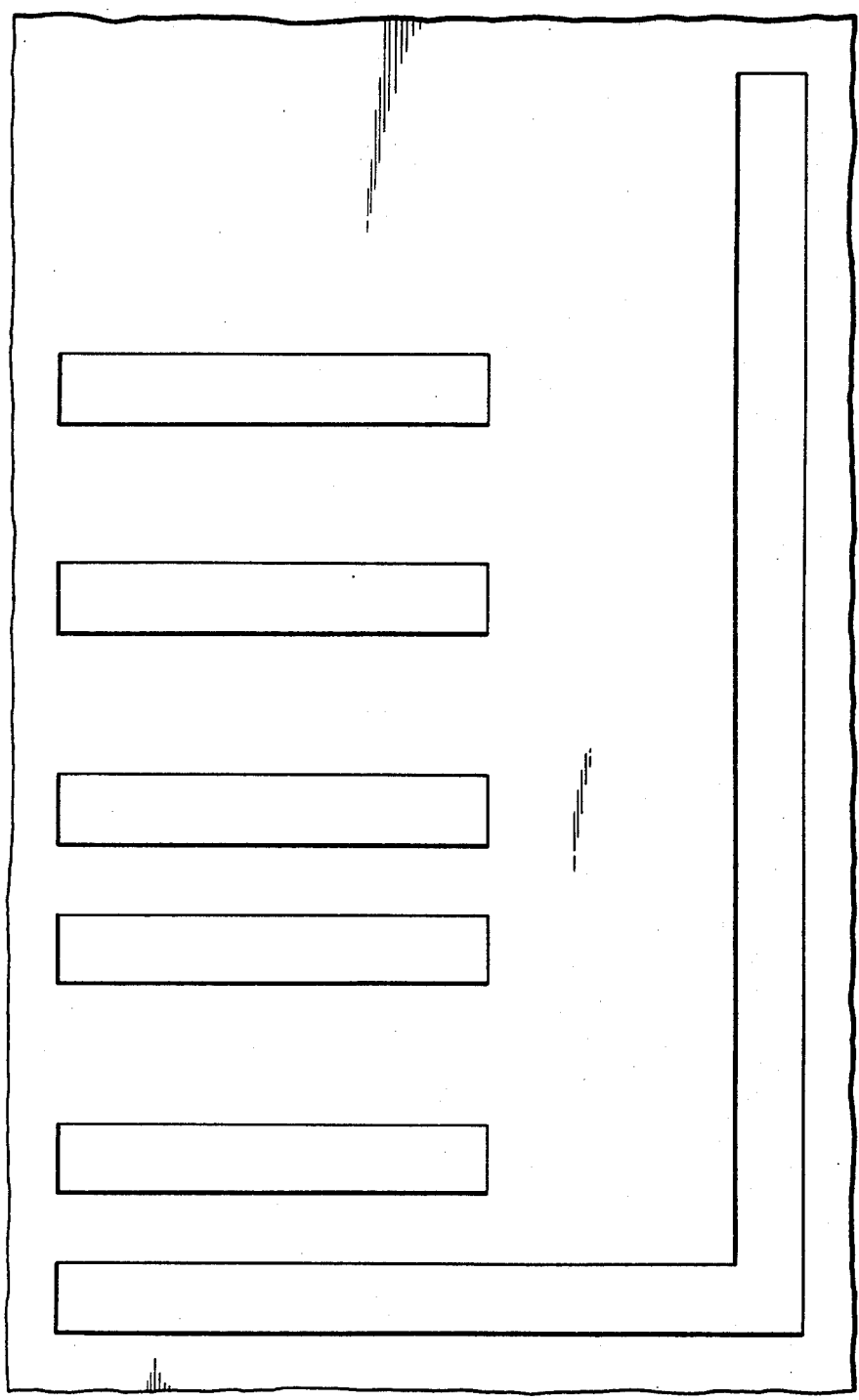

FIG. 22 is the outline of the metallization mask that provides the interconnections.

Since the circuit of FIG. 16A employs as an output transistor a depletion mode device, this type of circuit accommodation is accomplished by interchanging the layer of the starting structure to be used for the source and drain.

What has been described is a technique of fabrication of devices whereby the materials and their properties together with the process steps operate to limit the device dimensions.

Having thus described our invention, what we claim as new and desire to secure by Letters Patent is:

1. A field effect transistor in a monocrystalline body having an exposed surface comprising in combination
    a first high conductivity region having length and width dimensions in a first plane adjacent to and essentially parallel with said exposed surface,
        said first high conductivity region having
            a first bandgap and
            a first work function,
    a second high conductivity region having length and width dimensions in a second plane essentially parallel with said first plane,
        said second high conductivity region having
            a second bandgap and
            a second work function,
    a channel region epitaxially contiguous with positioned between, and forming
        a heterojunction with said first and said second high conductivity regions
            said channel region having length and height dimensions in a plane essentially orthogonal to said first and second planes
            said channel region further having
                a third bandgap and
                a third work function,
    said first bandgap adjacent said exposed surface being larger than said third bandgap in said channel,
    at least one of said first and said second work function being equal to said third work function
    gate electrode means operable to control carrier flow in said channel region and,
    ohmic electrode means on said first and second high conductivity regions.

2. The field effect transistor of claim 1 wherein said gate electrode means involves a schottky barrier.

3. The field effect transistor of claim 1 wherein said gate electrode means is made up of electrically connected gate segments on each side of said channel region.

4. The field effect transistor of claim 1 wherein said first high conductivity region is $Ga_{0.5}In_{0.5}P$, said channel region is GaAs and said source region is Ge.

5. The field effect transistor of claim 1 wherein said first high conductivity region is InP, said channel region is GaInAsP and said second high conductivity type region is InP.

6. The field effect transistor of claim 3 wherein said gate segments are electrically continuous with a gate contact positioned on and insulated from an exposed portion of said second high conductivity region.

* * * * *